(12) United States Patent
Boyle et al.

(10) Patent No.: US 9,352,417 B2
(45) Date of Patent: May 31, 2016

(54) INCREASING DIE STRENGTH BY ETCHING DURING OR AFTER DICING

(71) Applicant: Electro Scientific Industries, Inc., Portland, OR (US)

(72) Inventors: Adrian Boyle, Monasterevin (IE); Oonagh Meighan, Dublin (IE)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 14/029,664

(22) Filed: Sep. 17, 2013

(65) Prior Publication Data

US 2014/0231393 A1    Aug. 21, 2014

Related U.S. Application Data

(63) Continuation of application No. 13/448,604, filed on Apr. 17, 2012, now abandoned, which is a continuation of application No. 12/856,374, filed on Aug. 13, 2010, now abandoned, which is a continuation of application No. 10/511,743, filed as application No. PCT/EP03/04069 on Apr. 17, 2003, now Pat. No. 7,776,720.

(30) Foreign Application Priority Data

Apr. 19, 2002   (IE) .................................. S2002/0289
Oct. 28, 2002   (GB) .................................. 0225033.0

(51) Int. Cl.
*H01L 21/78*   (2006.01)
*B23K 26/12*   (2014.01)
(Continued)

(52) U.S. Cl.
CPC ........... *B23K 26/126* (2013.01); *B23K 26/0648* (2013.01); *B23K 26/123* (2013.01); *B23K 26/40* (2013.01); *H01L 21/78* (2013.01); *B23K 2201/40* (2013.01); *B23K 2203/50* (2015.10)

(58) Field of Classification Search
CPC ...................................................... B23K 26/126
See application file for complete search history.

(56) References Cited

U.S. PATENT DOCUMENTS 3,866,398 A  *  2/1975  Vernon, Jr. ............ B08B 15/007
                                                              134/1.3
4,355,457 A     10/1982 Barlett et al.
(Continued)

FOREIGN PATENT DOCUMENTS

JP           S5636226 B2     8/1981
JP           2002-305450    12/1990
(Continued)

OTHER PUBLICATIONS

Bahreyni et al., "Investigation and Simulation of XeF$_2$ Isotropic Etching of Silicon," *J. Vac. Sci. Technol.*, pp. 1850-1854, Nov./Dec. 2002.

(Continued)

*Primary Examiner* — Ha Tran T Nguyen
*Assistant Examiner* — Jordan Klein
(74) *Attorney, Agent, or Firm* — Stoel Rives LLP

(57) ABSTRACT

A substrate is diced using a program-controlled pulsed laser beam apparatus having an associated memory for storing a laser cutting strategy file. The file contains selected combinations of pulse rate Δt, pulse energy density E and pulse spatial overlap to machine a single layer or different types of material in different layers of the substrate while restricting damage to the layers and maximizing machining rate to produce die having predetermined die strength and yield. The file also contains data relating to the number of scans necessary using a selected combination to cut through a corresponding layer. The substrate is diced using the selected combinations. Gas handling equipment for inert or active gas may be provided for preventing or inducing chemical reactions at the substrate prior to, during or after dicing.

14 Claims, 9 Drawing Sheets

(51) Int. Cl.
*B23K 26/06* (2014.01)
*B23K 26/40* (2014.01)

(56) References Cited

U.S. PATENT DOCUMENTS

| | | | |
|---|---|---|---|
| 4,399,345 A | 8/1983 | Lapham et al. | |
| 4,478,677 A | 10/1984 | Chen et al. | |
| 4,610,079 A | 9/1986 | Abe et al. | |
| 4,639,572 A * | 1/1987 | Gruzman | B23K 26/0846 219/121.67 |
| 5,265,114 A | 11/1993 | Sun et al. | |
| 5,322,988 A * | 6/1994 | Russell | B01D 53/007 216/65 |
| 5,358,590 A * | 10/1994 | Yamanaka | G02F 1/1309 156/247 |
| 5,685,995 A | 11/1997 | Sun et al. | |
| 5,916,460 A * | 6/1999 | Imoto | B23K 26/12 219/121.67 |
| 5,976,691 A | 11/1999 | Noguchi et al. | |
| 6,130,401 A * | 10/2000 | Yoo | B23K 26/18 219/121.6 |
| 6,215,194 B1 | 4/2001 | Nakabayashi | |
| 6,290,864 B1 | 9/2001 | Patel et al. | |
| 6,420,245 B1 | 7/2002 | Manor | |
| 6,465,158 B1 * | 10/2002 | Sekiya | H01L 21/3043 257/E21.238 |
| 6,465,344 B1 | 10/2002 | Barton | |
| 6,531,681 B1 | 3/2003 | Markle | |
| 6,586,707 B2 * | 7/2003 | Boyle | B23K 26/40 219/121.69 |
| 6,642,127 B2 | 11/2003 | Kumar et al. | |
| 6,676,878 B2 * | 1/2004 | O'Brien | B23K 26/032 219/121.62 |
| 6,730,579 B1 | 5/2004 | Sasaka | |
| 6,770,544 B2 * | 8/2004 | Sawada | B23K 26/0853 257/E21.599 |
| 6,792,326 B1 * | 9/2004 | Duignan | B23K 26/04 430/11 |
| 6,817,776 B2 | 11/2004 | Colgan et al. | |
| 6,849,524 B2 | 2/2005 | Shelton et al. | |
| 6,902,990 B2 * | 6/2005 | Gottfried | B23K 26/0738 257/E21.238 |
| 7,157,038 B2 | 1/2007 | Baird et al. | |
| 7,265,034 B2 | 9/2007 | Lu et al. | |
| 7,638,435 B2 | 12/2009 | Lebouitz et al. | |
| 7,776,720 B2 | 8/2010 | Boyle et al. | |
| 7,906,410 B2 * | 3/2011 | Arita | H01L 21/78 438/460 |
| 8,652,940 B2 * | 2/2014 | Lei | H01L 21/78 438/460 |
| 2001/0002663 A1 | 6/2001 | Tai et al. | |
| 2002/0013061 A1 | 1/2002 | Siniaguine | |
| 2002/0019074 A1 * | 2/2002 | Nakazawa | H01L 21/67132 438/107 |
| 2004/0072388 A1 | 4/2004 | Sekiya | |
| 2004/0096163 A1 | 5/2004 | Colgan et al. | |
| 2004/0137700 A1 | 7/2004 | Sekiya | |
| 2004/0182817 A1 | 9/2004 | Murai et al. | |
| 2004/0212047 A1 | 10/2004 | Joshi | |
| 2004/0259329 A1 * | 12/2004 | Boyle | B23K 26/123 438/460 |
| 2006/0249480 A1 | 11/2006 | Boyle | |
| 2009/0191690 A1 * | 7/2009 | Boyle | H01L 21/78 438/462 |
| 2011/0029124 A1 | 2/2011 | Boyle et al. | |
| 2014/0231393 A1 | 8/2014 | Boyle et al. | |

FOREIGN PATENT DOCUMENTS

| | | |
|---|---|---|
| JP | 2003-183153 | 8/1991 |
| JP | 06238478 | 8/1994 |
| JP | 2007-201784 | 8/1995 |
| JP | 2007-273068 | 10/1995 |
| JP | 2000-031115 | 1/2000 |
| JP | 2000-091274 | 3/2000 |
| JP | 2002-543616 | 12/2002 |
| JP | 2004-260075 | 9/2004 |
| JP | 2005-051007 | 2/2005 |
| WO | WO-00/72224 A1 | 11/2000 |
| WO | WO-02/34455 A1 | 5/2002 |
| WO | WO-02/075794 | 9/2002 |
| WO | WO-03/078091 | 9/2003 |
| WO | WO-03/090258 | 10/2003 |

OTHER PUBLICATIONS

International Preliminary Report on Patentability, PCT/EP2005/011671, Feb. 26, 2007.

T. Chuang, Infrared Laser Radiation Effects on XeF2 Interaction with Silicon, Jan. 15, 1981, J.Chem. Phys, vol. 74, pp. 1461-1466.

* cited by examiner

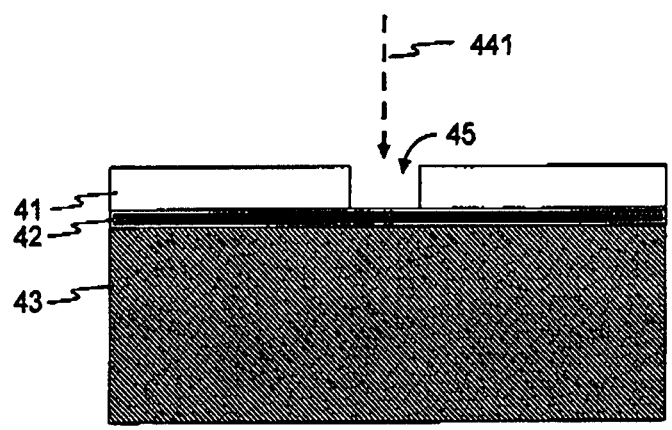
Fig. 4(iii)

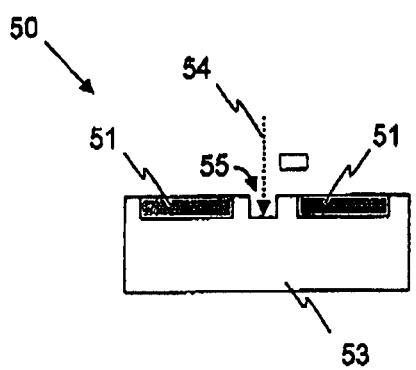
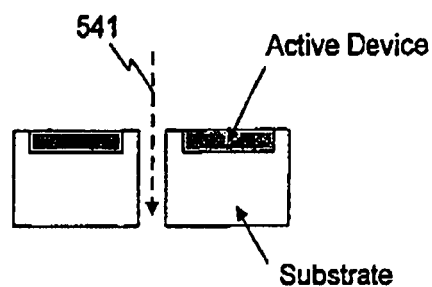
Fig. 5(i)a　　　　　Fig. 5(i)b
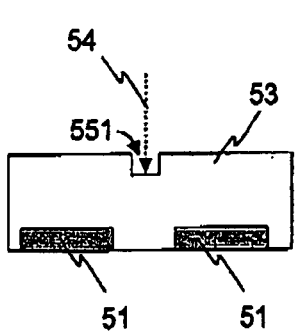
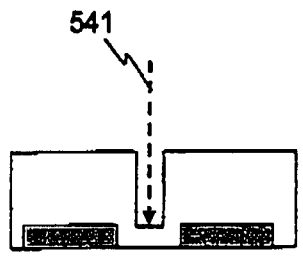
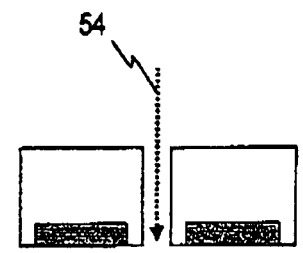
Fig. 5(ii)a　　　Fig. 5(ii)b　　　Fig. 5(ii)c

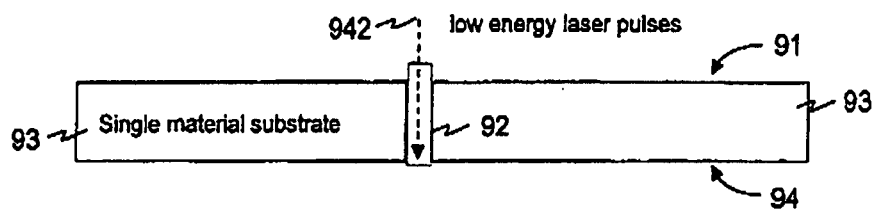
Fig. 9(iii)

INCREASING DIE STRENGTH BY ETCHING DURING OR AFTER DICING

RELATED APPLICATIONS

This application is a continuation of U.S. patent application Ser. No. 13/448,604, filed Apr. 17, 2012, abandoned; which is a continuation of U.S. patent application Ser. No. 12/856,374, filed Aug. 13, 2010, abandoned; which is a continuation of U.S. patent application Ser. No. 10/511,743, filed Apr. 18, 2005, now U.S. Pat. No. 7,776,720; which is a national stage application of International Application No. PCT/EP03/04069, filed Apr. 17, 2003; which claims priority to Irish Patent Application No. S2002/0289, filed Apr. 19, 2002, and to Great Britain Patent Application No. 0225033.0, filed Oct. 28, 2002.

TECHNICAL FIELD

The invention relates to program-controlled dicing of a substrate, particularly, but not limited to, a semiconductor substrate, using a pulsed laser.

BACKGROUND INFORMATION

Wafer dicing is a critical aspect of package assembly that facilitates all subsequent operations in an assembly process. Wafer dicing is conventionally achieved by dicing a wafer with a mechanical saw. Use of a mechanical saw has disadvantages such as low yield, chipping and cracking. Thin wafers cannot be machined due to the stresses induced in the wafer by the saw resulting in low die strength. The strength of the dies produced when a semiconductor substrate is diced is an important factor as low die strengths reduce reliability. Improving die strength minimizes breakages and the onset of micro-cracking and improves device reliability.

SUMMARY OF THE DISCLOSURE

According to a first aspect of the invention, there is provided a method of using a pulsed laser for program-controlled dicing of a substrate comprising at least one layer, the method comprising the steps of: providing program control means and associated data storage means for controlling the pulsed laser, providing in the associated data storage means a laser cutting strategy file of at least one selected combination of pulse rate, pulse energy and pulse spatial overlap of pulses produced by the laser at the substrate to restrict damage to the respective at least one layer while maximizing machining rate for the at least one layer, providing in the laser cutting strategy file data representative of at least one selected plurality of scans of the respective at least one layer by the pulsed laser necessary to cut through the respective at least one layer when the pulsed laser is operating according to the respective at least one combination stored in the laser cutting strategy file; and using the laser under control of the program control means driven by the laser cutting strategy file to scan the at least one layer with the respective at least one selected plurality of scans at least to facilitate dicing of the substrate such that a resultant die has at least a predetermined die strength and a yield of operational die equals at least a predetermined minimum yield.

Preferably, the steps of providing a laser cutting strategy file comprise, for each of the at least one layer, the steps of: varying at least one of a combination of pulse rate, pulse energy, pulse spatial overlap to provide a respective combination; measuring a cutting rate of the respective layer using the respective combination; examining the layer to determine whether damage is restricted to a predetermined extent; dicing the substrate and measuring yield of the resultant die; measuring die strength of the resultant die; creating a laser cutting strategy file of a selected combination which maximizes cutting rate while resulting in a yield of operational die which have at least the predetermined minimum yield and for which the die have at least the predetermined die strength scanning the at least one layer using the selected combination to determine a plurality of scans necessary to cut though the layer; and storing the selected plurality of scans in the laser cutting strategy file.

Conveniently, the die strength is measured using a Weibull die strength test.

Advantageously, the step of using the laser to scan the at least one layer includes providing a galvanometer-based scanner.

Conveniently, the step of using the laser to scan the at least one layer includes providing a telecentric scan lens for scanning a laser beam from the laser across the substrate and the step of providing a laser cutting strategy file comprises the steps of: mapping a laser energy density received in a focal plane of the telecentric scan lens to produce a laser energy density map of a field of view of the telecentric lens using the selected combination of pulse rate, pulse energy and pulse spatial overlap of pulses; storing the laser energy density map as an array in the storage means; and using the laser energy density map to modify, with the control means, at least one of the pulse repetition rate and the pulse energy of the selected combination to produce a constant laser energy density at scanned points in the field of view at the substrate.

Conveniently, the step of mapping a laser energy density comprises using a laser power meter to measure laser energy density at representative locations within the field of view of the telecentric lens.

Advantageously, the step of providing a selected combination comprises providing a selected combination which restrict thermal loading of the material of the respective layer to restrict mechanical stress to a predetermined maximum.

Conveniently, the selected combination is used for less than the selected plurality of scans, which corresponds to the selected combination, to machine a layer to be cut and the layer is scanned for further scans up to the selected plurality using a combination which will not significantly machine an underlying layer such that substantially no machining occurs of the underlying layer should the laser continue to scan the substrate after the layer to be cut has been cut through.

Advantageously, the method comprises scribing a substrate through the layer to be cut for subsequent mechanical dicing of the substrate.

Conveniently, where the substrate includes an active layer, the step of providing a selected combination to restrict damage to the at least one layer comprises providing a selected combination which does not significantly affect the subsequent operation of active devices in the active layer.

Advantageously, the step of providing a selected combination which does not significantly affect the subsequent operation of active devices in the active layer comprises providing a combination which does not cause significant cracks to propagate through the active layer.

Conveniently, the step of providing a selected combination comprises the steps of: providing an initial combination at which the laser machines the substrate at an initial rate which does not cause significant crack propagation due to thermal shock at an ambient temperature, and such that a temperature of the substrate is raised by the machining after a predetermined plurality of scans of the substrate by the laser to a raised temperature above ambient temperature; and providing a working combination at which the laser machines the substrate at a working rate, higher than the initial rate, which does not cause significant crack propagation due to thermal shock at the raised temperature; and the step of machining the substrate includes: machining an initial depth of the substrate using the initial combination for at least the predetermined plurality of scans; and machining at least part of a remaining depth of the substrate using the working combination.

Preferably, an energy of at least a first of the plurality of scans is lower than an energy of succeeding scans of the plurality of scans such that a generation of surface microcracks is less than would otherwise be produced.

Advantageously, an energy of at least a final of the plurality of scans is lower than an energy of preceding scans of the plurality of scans such that backside chipping of the substrate is less than would otherwise be produced.

Advantageously, energy of the plurality of scans is varied between scans to facilitate removal of debris generated during dicing of the substrate, conveniently by increasing laser energy with increasing machining depth to remove debris from a dice lane.

Advantageously, the method includes the further steps of: providing gas handling means to provide a gaseous environment for the substrate; using the gaseous environment to control a chemical reaction with the substrate at least one of prior to, during and after dicing the substrate to enhance a strength of the resultant die.

Conveniently, the step of providing gas handling means includes providing gas delivery head means for delivering gas substantially uniformly to a cutting region of the substrate to facilitate substantially uniform cutting of the substrate.

Advantageously, the step of providing gas handling means comprises providing means to control at least one of flow rate, concentration, temperature, type of gas and a mixture of types of gases.

Conveniently, the step of providing a gaseous environment comprises providing a passive inert gas environment for substantially preventing oxidation of walls of a die during machining.

Alternatively, the step of providing a gaseous environment comprises providing an active gas environment.

Conveniently, the step of providing an active gas environment comprises etching walls of a die with the active gas to reduce surface toughness of the walls and thereby improve the die strength.

Advantageously, the step of providing an active gas environment comprises etching walls of a die with the active gas substantially to remove a heat affected zone produced during machining, and thereby improve the die strength.

Advantageously, the step of providing an active gas environment comprises reducing debris, produced during machining, adhering to surfaces of machined die.

Conveniently, the method comprises the further step after dicing of scanning an edge of the resultant die with the laser with sufficient energy to heat sidewalls of the resultant die to reduce surface roughness thereof and thereby increase die strength of the resultant die.

Conveniently, the method is adapted for producing die with rounded corners by scanning the laser beam along a curved trajectory at corners of the die using a galvanometer based scanner, wherein the selected combination is adapted to maintain the selected pulse spatial overlap between consecutive laser pulses around an entire circumference of the die.

Conveniently, the selected combination is adapted to deliver pulses at an arcuate portion or corner of the die such that substantially no over-cutting or undercutting generating a defect at the arcuate die edge or corner occurs.

Advantageously, the method is adapted for forming a tapered dice lane having arcuate walls tapering inwards in a direction away from the laser beam by varying a width of the dice lane as the laser scans through the substrate wherein the selected combination is modified to give a finely controlled taper and smooth die sidewalls, and thereby increase die strength of the resultant die.

Conveniently, the laser is a Q-switched laser device.

Preferably, a laser beam from the laser is directed by rotatable mirrors.

Conveniently, the substrate is mounted on a tape and energy of final scans of the laser is controlled substantially to prevent damage to the tape.

Preferably, the tape is substantially transparent to ultraviolet radiation.

Advantageously, the tape is polyolefin-based.

According to a second aspect of the invention, there is provided an apparatus for program-controlled dicing of a substrate comprising at least one layer, the apparatus comprising: a pulsed laser; and program control means and associated data storage means for controlling the pulsed laser using a laser cutting strategy file, stored in the data storage means, of at least one respective selected combination of pulse rate, pulse energy and pulse spatial overlap of pulses produced by the laser at the substrate and data representative of at least one respective selected plurality of scans of the respective at least one layer by the pulsed laser necessary to cut through the respective at least one layer; such that in use a resultant die has at least a predetermined die strength and a yield of operational die equals at least a predetermined minimum yield.

Preferably, the program control means includes control means for varying at least one of pulse rate, pulse energy and pulse spatial overlap for controlling the laser subject to the at least one respective selected combination.

Conveniently, the apparatus includes telecentric scan lens means for scanning a laser beam from the laser across the substrate.

Advantageously, the apparatus includes laser power measuring means for mapping a laser energy density received in a focal plane of the telecentric scan lens to produce a laser energy density map of a field of view of the telecentric lens using the selected combination of pulse rate, pulse energy and pulse spatial overlap of pulse for stowing the laser energy density map as an array in the data storage mean for modifying the at least one respective selected combination to compensate for irregularities, introduced by the telecentric lens, of laser energy density at the substrate.

Preferably, the apparatus flier comprises gas handling means for providing a gaseous environment for the substrate for controlling a chemical reaction with the substrate at least one of prior to, during and after dicing the substrate to enhance strength of the resultant die.

Advantageously, the gas handling means includes gas delivery head means for uniformly delivering gas to a cutting region of the substrate.

Preferably, the gas handling means comprises control means for controlling at least one of flow rate, concentration, temperature, type of gas and a mixture of types of gases.

Conveniently, the gas handling means is arranged to provide an inert gas environment for substantially preventing oxidation of walls of a die during machining.

Alternatively, the gas handling means is arranged to provide an active gas environment.

Advantageously, the gas handling means is arranged to etch walls of a die with the active gas to reduce surface roughness of the walls, and thereby increase die strength.

Advantageously, the gas handling means is arranged to etch walls of a die with the active gas substantially to remove a heat affected zone produced during machining, and thereby increase die strength.

Advantageously, the gas handling means is arranged to etch walls of a die with the active gas to reduce debris, produced during machining, adhering to surfaces of machined die.

Conveniently, the apparatus further comprises a galvanometer-based scanner for producing die with rounded corners by a laser beam along a curved trajectory at corners of the die, wherein the selected combination is arranged to maintain the selected pulse spatial overlap between consecutive laser pulses around an entire circumference of the die.

Advantageously, the selected combination is arranged to control laser pulse delivery at an arcuate portion or corner of a die edge such that substantially no over-cutting or under-cutting occurs which would generate a defect at the die edge.

Conveniently, the apparatus is arranged for forming a tapered dice lane having arcuate walls tapering inwards in a direction away from the laser beam by varying a width of the dice lane as the laser scans through the substrate wherein the selected combination is modified to give a finely controlled taper with smooth die walls, and thereby increase die strength of the resultant die.

Preferably, the laser is a Q-switched laser device.

Conveniently, the apparatus includes rotatable mirrors directing a laser beam from the laser on the substrate.

Preferably, the apparatus is arranged for a substrate mounted on a tape, wherein the laser is controlled in final scans of the substrate not substantially to damage the tape.

Conveniently, the tape is substantially transparent to ultra-violet light.

Advantageously, the tape is polyolefin-based.

BRIEF DESCRIPTION OF THE DRAWINGS

The invention will be more clearly understood from the following description of some embodiments thereof, given by way of example only with reference to the accompanying drawings in which:

FIGS. 5(i)a and 5(i)b are vertical cross-sections of a semiconductor substrate diced from an active device side according to the invention;

FIGS. 5(ii)a to 5(ii)c are vertical cross-sections of a semiconductor substrate diced from a side opposed to the active device side according to the invention;

DETAILED DESCRIPTION OF PREFERRED EMBODIMENTS

Figure 1:
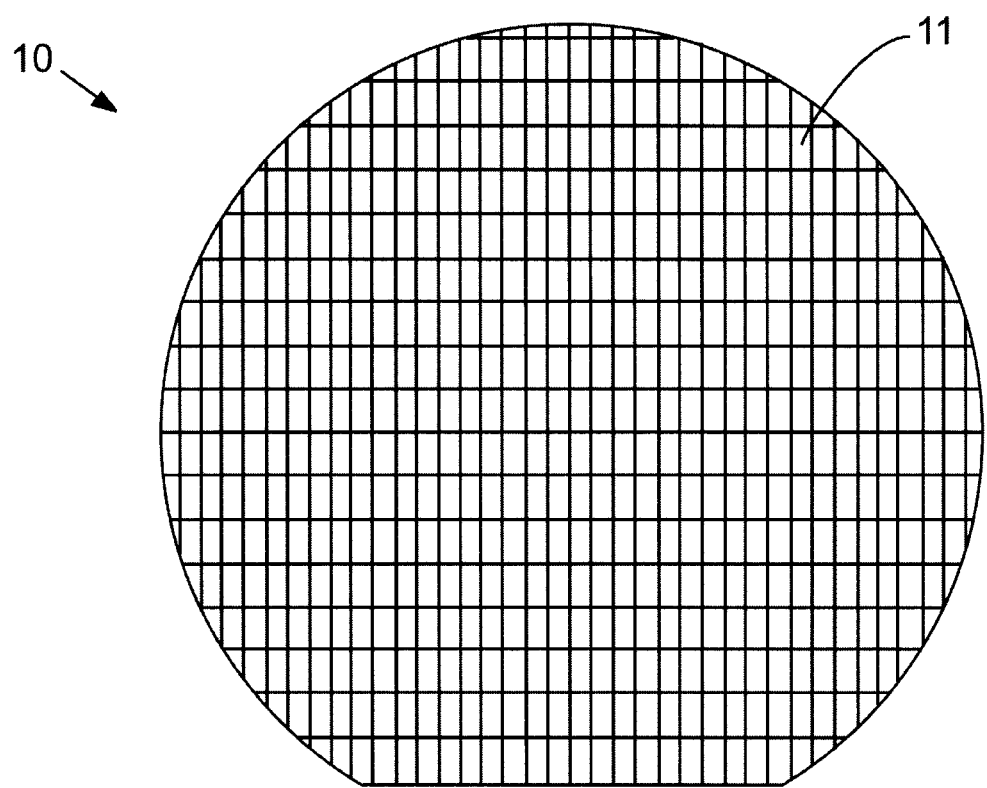
FIG. 1 is a plan view of a diced silicon wafer.

A laser beam may be used to dice a semiconductor wafer 10 and thereby singulate devices 11 from the wafer by scanning a Q-switched laser beam over the wafer surface using rotating mirrors in a galvanometer type system to form a pattern such as that shown in FIG. 1. Focusing of the laser beam may be achieved using a telecentric type scan lens.

In embodiments of this invention, the temporal separation of consecutive laser pulses ($\Delta t$) and the laser pulse energy (E) is varied during machining of a single or multilayered substrate in order to reduce thermal loading in different portions of the single layer or in each of the materials in the substrate and the subsequent mechanical stress or damage that results.

Figure 3I:
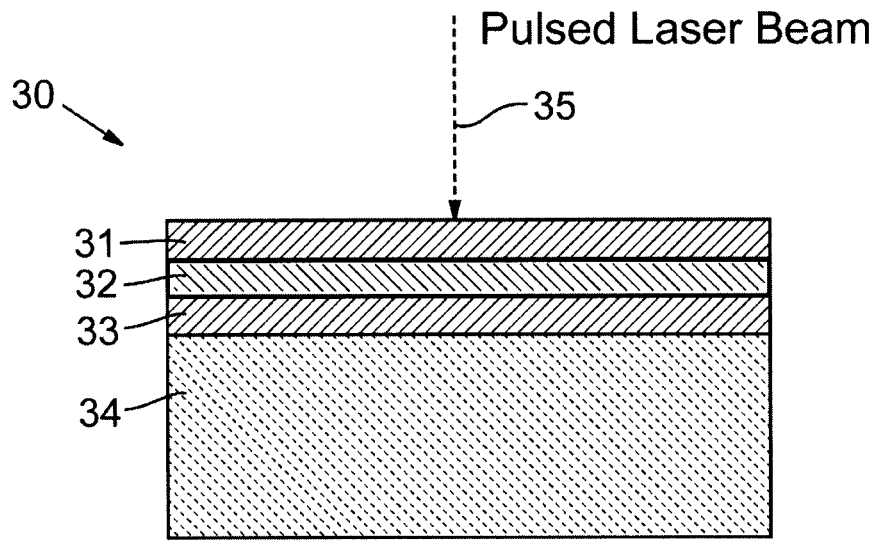
FIG. 3(i) is a vertical cross-section of a multilayered substrate suitable for dicing according to the invention.
Figure 3:
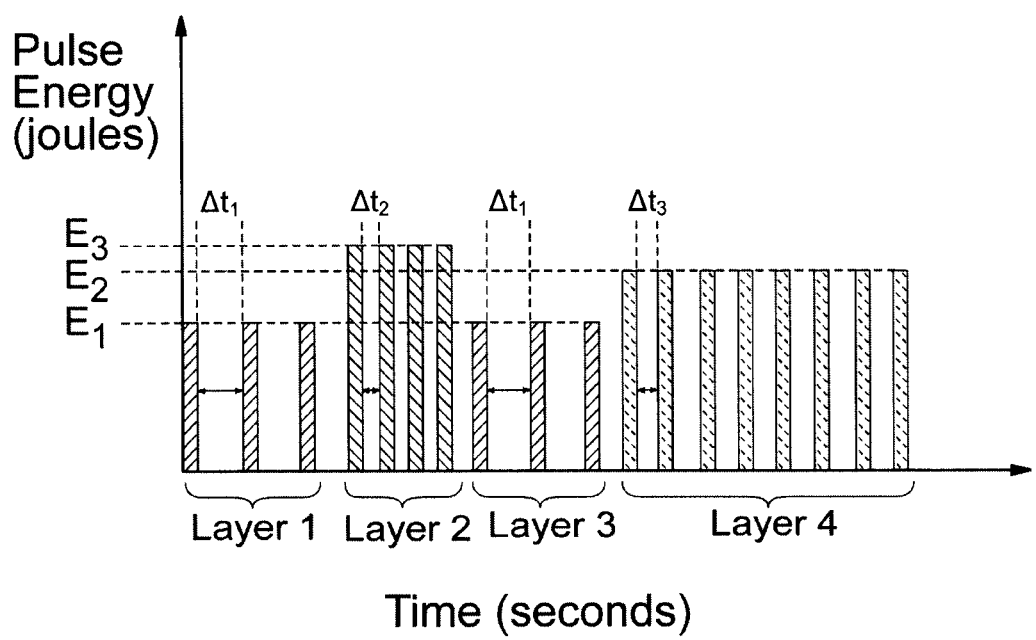
FIG. 3(ii) represents a four-step laser process used to dice the multilayered substrate in FIG. 3(i) according to the invention.

By way of example, a multilayered material workpiece 30 consisting of four layers 31, 32, 33 and 34 of three different material types is shown in FIG. 3(i). These materials could be, for example, a polymer material first layer 31 on a metal second layer 32 on a polymer third layer 33 on a semiconductor substrate 34. FIG. 3(ii), which is a plot of time (corresponding to distance machined though the multilayers) as abscissa and pulse energy as ordinates, illustrates a four step approach to dicing the substrate. In order to machine the first layer 31 in such a way as to reduce thermal loading and consequent mechanical damage in the polymer material laser pulse energy $E_1$ is low and an inter-pulse separation $\Delta t_1$ is high. Polymer materials will melt and be damaged at high laser energies of, for example several hundred microJoules per pulse, but they will be cut cleanly at lower laser pulse energies, for example 10 microJoules per pulse. Also if the repetition rate is too high (i.e. $\Delta t$ is too low) too much heat will enter the polymer material over too short a time and the polymer will melt and be damaged, so for polymers the repetition rate is kept low (i.e. $\Delta t$ is high). In general, values of $\Delta t$ and E are chosen based on known optical and thermal properties of the material or are determined experimentally. The number of laser pulses delivered at $\Delta t_1$ and $E_1$ is determined by the thickness of first layer 31.

After machining through the first layer 31 with laser beam 35, the laser parameters are changed to $\Delta t_2$ and $E_3$, where chosen values of $\Delta t_2$ and $E_3$ (like $\Delta t$ and E for all layers in the substrate) are determined by the thermal properties and also the optical absorption properties of the material at the laser wavelength used. After the machining of the second layer 32, the laser properties are returned to $\Delta t_1$ and $E_1$ to machine the third layer 33 which is of similar material to the first layer 31. After machining of the third layer 33, the laser properties are changed to $\Delta t_3$ and $E_2$ to machine the fourth layer 34. During machining of each layer in the multilayer substrate the pulse energies $E_1$, $E_2$ and $E_3$ may be varied in a manner to be described across the field of view of the focusing objective in order to compensate for irregularities in the laser energy transmitted by the telecentric lens, to ensure uniformity of machining through each layer of the substrate.

In practice, prior to machining the layered substrate, a laser cutting strategy file is generated to contain a series of commands to the laser to change Δt and E for each layer and to control a galvanometer scanner for positioning of the laser beam on the workpiece surface. In addition, a respective number of laser scans necessary to cut through each respective layer is pre-programmed in the laser cutting strategy file from a prior knowledge of thicknesses of each of the layers 31, 32, 33, 34.

Initially, this data may be collected experimentally, by scanning layers of different materials using different pulse energies and pulse repetition rates and observing any damage, for example melting or crack propagation in the layer. The resultant effect on die strength of different pulse energies and pulse repetition rates may also be determined using, for example, a known Weibull die strength test and a combination selected for each layer which produces die with at least required die strength. In addition, the yield of die may be determined to ensure that the selected combination is not damaging devices on the substrate and thereby adversely affecting the yield. Having selected a combination of pulse energy and pulse repetition rate which causes only acceptable damage and produces die of a required die strength and acceptable yield, the number of scans required to cut though a known thickness of material may then also be determined experimentally. These values may then be used to write, the laser cutting strategy file.

Dicing in this way leads to superior die strength compared with conventional laser dicing methods.

Figure 4I:
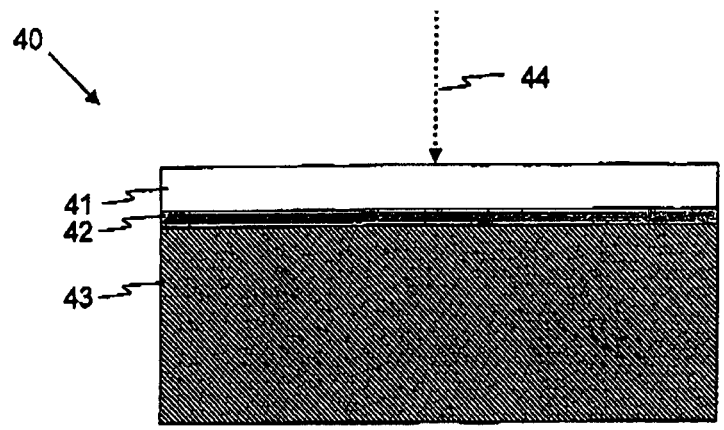
FIGS. 4(i) to 4(iii) are vertical cross-sections of a multi-layered structure in which a pre-scribe trench is machined in a top layer according to the invention.
Figure 4:
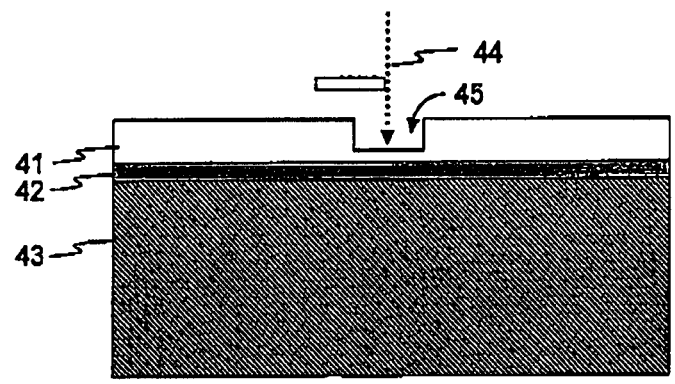

In a further embodiment of this invention, the inter-pulse temporal separation Δt and the laser pulse energy E are changed during the machining of a single layer of a multilayered material. Referring to FIGS. 4(i) to 4(iii), a first layer 41 to be machined with a laser beam 44 overlies a second layer 42 on a substrate 43. As the first layer 41 is machined, the pulse properties Δt and E of the laser beam 44 are changed just prior to completion of machining through the first layer 41, as illustrated by the changed broken line representing the changed laser beam 441, during machining of the first layer 41 in order to prevent damage to an underlying second layer 42. In general, damage to the underlying layer 42 is prevented by reducing the pulse energy E to below a melting threshold of the material constituting the underlying layer. A trench 45 machined in layer 41 of FIG. 4 can be used as a pre-mechanical scribing trench. In this case die strength is improved compared with the prior art as, by appropriate choices of laser pulse energy and pulse repetition rate, there is no cracking in the top layer 41 or in the underlying layer 42 that could grow during a mechanical scribe and break process performed after the laser prescribe step.

In a further embodiment of this invention, illustrated in FIG. 5, low energy laser pulses of a laser beam 54 are used in a first few passes along a dice lane 55 in order to prevent the development of large cracks propagating through active devices 51 when machining from an active device side of the wafers 50, as shown in FIG. 5(i)a. After the laser has cut through a depth of material approximately equal to an active device layer thickness a pulse energy E of the laser beam 54 can be increased to a higher pulse energy of a laser beam 541 under control of a laser cutting strategy file, as shown in FIG. 5(i)b, in order to machine more quickly the bulk of a semiconductor substrate 53 of the wafer 50, which is heated by the initial machining so that effects of thermal shock in machining the substrate 53 are reduced. When machining instead from a back side of a wafer substrate 53, as shown in FIG. 5(ii)a, opposed to a side caring the active devices 51, a similar process can be adopted in order to prevent cracks propagating from the initial laser cut down through the substrate material and so the laser beam 54 with a low laser pulse energy is used initially. In the bulk of the semiconductor substrate 53 the laser energy is increased under control of a laser cutting strategy file using higher energy laser beam 541 for faster machining, see FIG. 5(ii)b. When the laser beam 541 machining from the backside of the wafer 50 reaches a region containing active devices 51, the laser pulse energy of the laser beam 54 is reduced under control of the laser cutting strategy file to prevent excessive damage in this region, see FIG. 5(ii)c. In order to control laser machining in this manner, the laser cutting strategy file also contains data representative of a number of scans necessary to pass through the active layer and through the remainder of the substrate respectively, and the number of initial scans necessary to raise the temperature of the substrate to a temperature at which the effects of thermal shock are insignificant at the raised temperature and raised pulse energy.

Figure 9I:
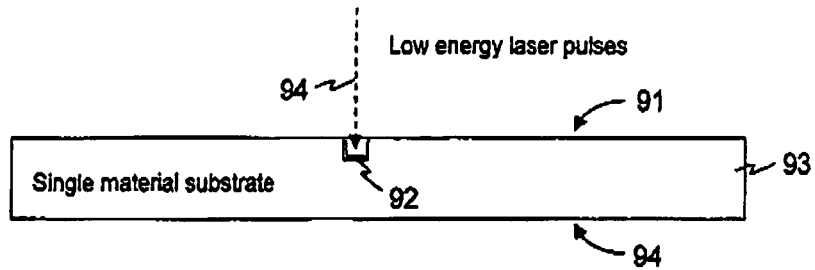
FIGS. 9(i) to 9(iii) are vertical cross-sections of a single layer structure machined, according to the invention.
Figure 9:
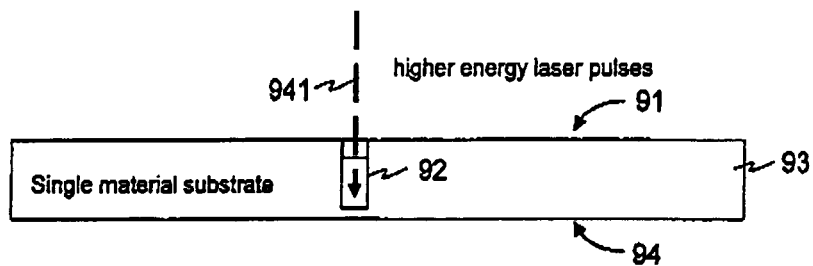

In a further embodiment of the invention, illustrated in FIG. 9, when machining, for example, a trench or dice lane 92 in, for example, a single layer substrate 93, by multi-pass cutting, a laser beam 94 with lower pulse energy is used during an initial pass or passes than a laser beam 941 used when cutting a bulk of the substrate in order to prevent, or at least to reduce to a lower degree than would otherwise occur, generation of surface micro-cracks in a first surface 91 from which the substrate 93 is machined. Similarly, the energy of final passes of a laser beam 942 may be reduced below that used for cutting the bulk of the substrate 93, to prevent, or at least to reduce below a degree than would otherwise occur, chipping or cracking of a second surface 94 of the substrate opposed to the first surface 91, or, for example, at a base of a trench. In the bulk of the substrate 93 higher energy pulses are used for efficient material removal. The pulse energy may be increased with increasing machining depth in order to facilitate more efficient material removal.

Figure 10:
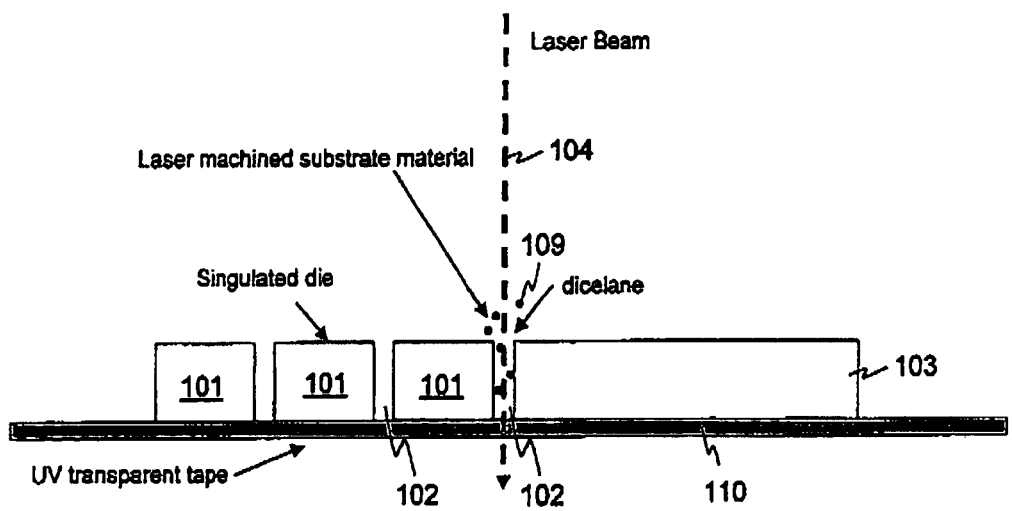
FIG. 10 is a vertical cross-section of a substrate, machined according to the invention, mounted on a carrier tape

Moreover, referring to FIG. 10, energy of a laser beam 104 may be varied throughout machining of a substrate 103 to facilitate removal of debris 109 generated by the machining. That is, a higher peak power of the laser beam 104 is used deep within the substrate than close to surfaces of the substrate.

Figure 6:
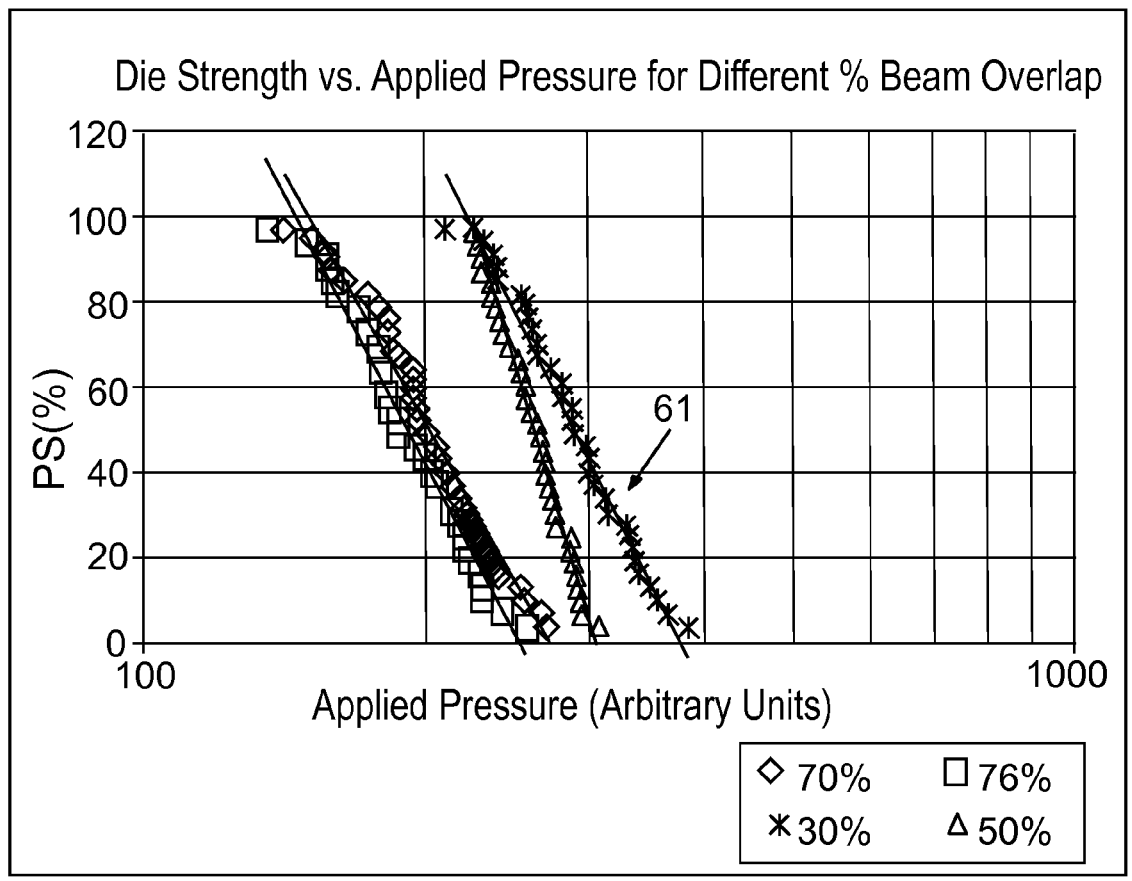
FIG. 6 is a graph, helpful in understanding the invention, of relative die strength as abscissa and proportion of die surviving as ordinates for different spatial overlaps of successive laser pulses.

The mechanical die strength of laser cut die is a function of the spatial overlap between consecutive laser pulses. The spatial overlap between consecutive laser pulses is therefore preferably chosen so as to yield optimum mechanical die strength of die obtained from a substrate to be machined. For example, the dependence of mechanical die strength of a silicon substrate machined using a 355 nm Q-switched laser is shown in FIG. 6, where a probability of survival of a pressure test is plotted as ordinates against a pressure applied to a die as abscissa for a series of pulse overlaps from 30% to 76%. It is apparent in this case, that the plot 61 having the highest die strengths is obtained for a pulse overlap of 30%. It would appear that if the laser pulse overlap is too high there is too much heating in a region and too much cracking. If the laser pulse overlap is lower there is less thermal damage in a region and less cracking. In practice, a suitable overlap to give a required die strength and yield may be determined experimentally and stored in the laser cutting strategy file for use during machining. It will be understood that the spatial overlap of laser pulses is in fact a function of the scanning speed the pulse repetition rate and the diameter of the incident laser beam, so that only these parameters need be stored in the laser cutting strategy file.

When a telecentric lens is used to focus a laser beam the received laser intensity varies across a field of view of the telecentric lens. Laser parameters may be changed depending on the location of a focal spot within a field of view of the focusing scan lens objective in order to maintain a constant power density at the workpiece surface across the entire field of view. The variation in transmitted laser intensity as a percentage of incident laser intensity over the field of view of a typical telecentric scan lens is shown in a contour plot 20 in an upper half of FIG. 2. Such a contour plot may be obtained by placing a laser power meter beneath the telecentric lens in a plane in which the substrate or workpiece is to be located. Laser power readings are recorded at a number of positions across the field of view of the lens (typically 40 mm×40 mm) and then plotted as a two dimensional surface plot. The irregularities in the laser power density map are mainly due to the quality of the antireflection coating on the lenses. A telecentric lens consists of a number of lenses and any irregularities in thickness or quality of the coating on any of these lenses can cause the observed irregularities in the laser power density map. Also, due to the geometry of a telecentric lens, its inherent performance is not so good at the edges of the field of view so the laser power density is reduced because of distortion in the laser beam profile caused by the telecentric lens itself.

Figure 2:
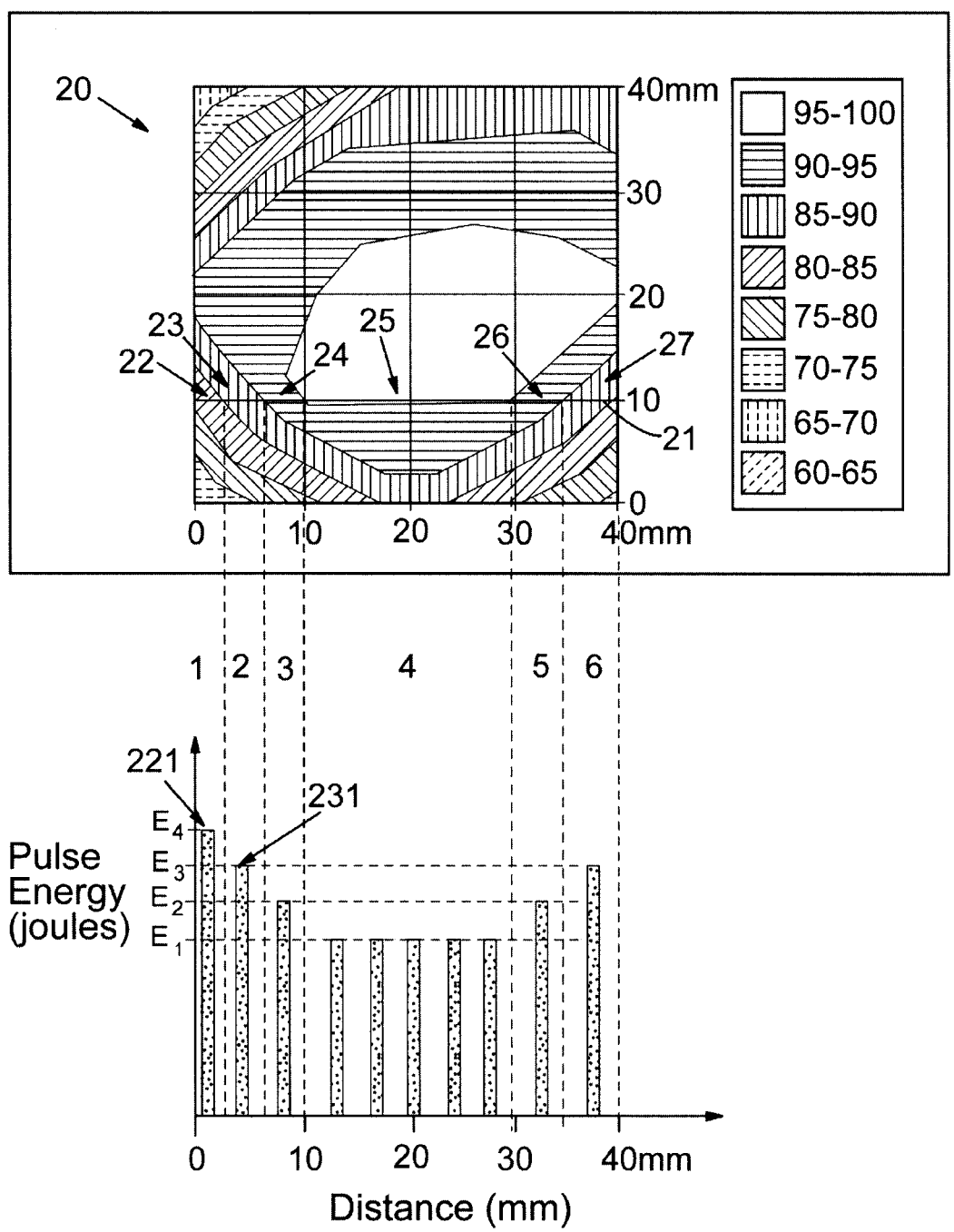
FIG. 2 shows transmitted laser intensity as a percentage of incident laser intensity over a field of view (40 mm×40 mm) of a telecentric scan lens objective for use with the invention and also the variation in laser pulse energy for machining a trench of uniform depth according to the invention.

Maintaining a constant power density across the entire scan lens field of view necessitates changing at least one of laser pulse energy and laser repetition frequency. In this embodiment of the invention, laser parameters are changed depending on the location of a focal spot within the field of view of the focusing objective in order to maintain a constant power density at the workpiece surface across the entire field of view. The variation in transmitted laser intensity as a percentage of incident laser intensity over the field of view of a typical telecentric scan lens is shown in FIG. 2. Maintaining a constant power density across the entire scan lens field of view necessitates changing at least one of the laser pulse energy and the laser repetition rate and conveniently changing the laser pulse energy at a fixed laser repetition frequency or, alternatively, changing the laser repetition frequency at a fixed laser pulse energy. Power density ($\phi$) is defined as the power (P in units of Watts) per unit area (A in units of centimeters squared) at the focal spot of the laser and is given by $$\varphi = \frac{P}{A}$$

Where the power equals the pulse energy (E in units of Joules) per second (s)

$$P = \frac{E}{s}$$

By way of example, a lower half of FIG. 2, which is a plot of pulse energy as ordinates versus distance along the line 21, which is 10 mm from the lower edge of the field as seen in the upper half of FIG. 2, demonstrates the modification of laser pulse energy that is required to maintain a constant power density at the substrate while scanning the laser across the field of view of the scan lens to compensate for the variation in transmitted laser intensity by the telecentric lens. In this example, the laser is scanned along straight line 21 which is 40 mm in length, 10 mm from the center of the lens. In the upper half of FIG. 2 the field of view of the lens is divided into regions wherein the intensity at each point in a given region is within ±5% of all points in that region. For the 40 mm line 21 scanned by the laser in this example, six different regions, corresponding to six portions 22, 23, 24, 25, 26, 27 of the scan line 21, are traversed and as a result the laser energy is changed, under the control of the laser cutting strategy file, five times. The laser pulse energy starts at value 221 of $E_4$ in region 1 for a first portion 22 of scan line 21. The transmitted laser intensity at the workpiece in region 1 is 80 to 85% of the laser intensity incident on the scan lens and as region 1 represents the region of lowest incident laser intensity compared to all the regions 2 to 6, the energy per laser pulse $E_4$ in region 1 is consequently the highest. As the laser is scanned from region 1 to region 2, corresponding to a second portion 23 of scan line 21, the transmitted laser intensity increases to 85 to 90% of the laser intensity incident on the scan lens and in order to maintain a constant power density on the surface of the workpiece the laser pulse energy is now reduced to a value 231 of $E_3$, where $E_3$ is 5% lower in energy than $E_4$. As the laser beam traverses from one region to the next the laser pulse energy is changed, under control of the laser cutting strategy file, 'on the fly' (on a pulse to pulse basis if required) in order to maintain a constant value of power density ($\phi$) at the workpiece surface along the entire 40 mm length of the dice lane 21.

In summary, the laser power density $\phi$ at the workpiece surface is directly proportional to the laser pulse energy E. The value of the laser pulse energy at the workpiece surface will differ from that emerging directly from the laser due to attenuation in the scan lens. The contour map is stored as a two dimensional array in a computer memory associated with a computer control of the laser and depending on where the software directs the galvanometer scanner to place the laser beam in the field of view, a simultaneous command is sent to the laser to change the pulse repetition rate and the laser pulse energy as indicated in the laser cutting strategy file. Laser power may also be monitored by an integral power meter in the laser head itself and any variation in power in the laser can be compensated for. In principle, rather than storing the contour map the laser power could be monitored at the workpiece or substrate but there would be a loss of laser power in doing so, and preferably the contour map is stored in memory. In accordance with the invention, the combination of pulse repetition rate and pulse energy are controlled during scanning, the laser pulse energy E is varied in indirect proportion to the transmission of the telecentric scan lens, in order to maintain a constant power density at the workpiece surface across the entire field of view of the scan lens. This permits, for example, the machining of dice lanes and pre-scribing trenches of uniform depth, where the depth of the dice lane is directly proportional to the power density $\phi$. In instances where a substrate is laser machined so that the laser cuts down through the entire thickness of the substrate, maintaining uniform power density across the entire dice lane prevents partial cutting of dice lanes. Partial cutting of dice lanes leaves material between adjacent die and during the pick and place process, when die are picked from a transport tape, such die which are stuck together may break apart causing damage to the die, thus reducing significantly their mechanical strength.

Laser dicing in accordance with the invention may be performed in a non-ambient gas environment controlled by a gas handling system. Gas parameters such as S flow rate, concentration, temperature, gas type and gas mixes may be controlled at least one of prior to, during and after the laser dicing process. A series of different gases may be used at least one of prior to, during and after the laser machining processes.

A gas delivery head may be used to ensure gas is uniformly delivered to a cutting region of the substrate such that uniform cutting is achieved.

Gases used may be passive or reactive with respect to the semiconductor substrate and/or layers in the semiconductor wafer or substrate. Inert gases (e.g. argon and helium) may be used to prevent growth of an oxide layer on the die walls during laser machining. Gases that react with silicon (e.g. chlorofluorocarbons and halocarbons) may be used at least one of prior to, during and after laser machining to reduce the surface roughness of die sidewalls by etching the substrate material. Also, a heat affected zone (HAZ) produced on the die sidewalls as a result of laser machining can be etched away using a reactant gas. In this way the quality of the die sidewalls is improved and therefore the die strength is increased. Also reactive gases reduce the amount of debris adhering on die sidewalls and top and bottom surfaces, thus reducing potential stress points on laser machined die.

In a further embodiment of this invention, the laser pulse energy is reduced to a value close to the melting threshold of the wafer material (after die singulation) and the laser is scanned along the die edge in order to heat (rather than ablate) the die sidewalls. In doing so, the surface roughness of the die sidewalls is reduced and the uniformity of the heat affected zone is increased, thus resulting in increased die strength.

Figure 7I:
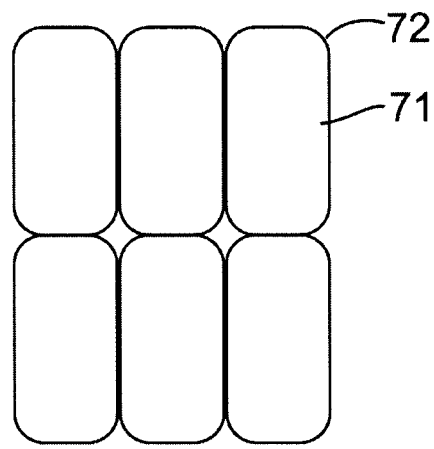
FIG. 7(i) shows a plurality of die with rounded corners, produced according to the invention.
Figure 7:
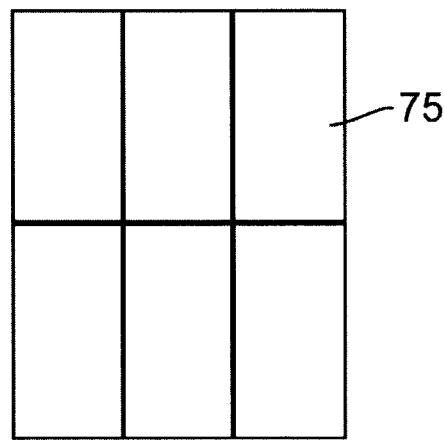
FIG. 7(ii) shows a plurality of conventionally diced die according to the prior art.

In a further embodiment of his invention, the laser is scanned in such a way as to machine die 71 with rounded corners 72 as shown in FIG. 7(i). Die 75 diced with a conventional mechanical saw according to the prior art are shown in FIG. 7(ii). Rounded corner geometry is easier to achieve and is more accurate when using a galvanometer based laser machining system rather than a conventional mechanical saw based dicing system. However, the laser pulse properties must be changed at the rounded corner sections if as is typically the case, the galvanometer scanning mirrors used to direct the laser beam have to slow down as they traverse the curved features. Otherwise, when the scanning mirrors slow down the laser pulse spatial overlap would increase, therefore the time between pulses, $\Delta t$, needs to be increased in order to maintain an overlap on the rounded corner sections that is the same as a spatial overlap used on sight regions of the die. This data is stored in the laser cutting strategy file for controlling the laser beam during machining. Using a laser to produce die with rounded corners improves die strength and enables dicing of thin wafers. The rounded corners eliminate stresses that are induced by sharp corners of rectangular die.

In addition, machining may be controlled by the laser cutting strategy file and program control such that pulse delivery on a corner or curved portion of a die edge is such that a "clear" corner or curved section is obtained with no overcutting or undercutting which may otherwise generate a defect at the die edge.

Figure 8:
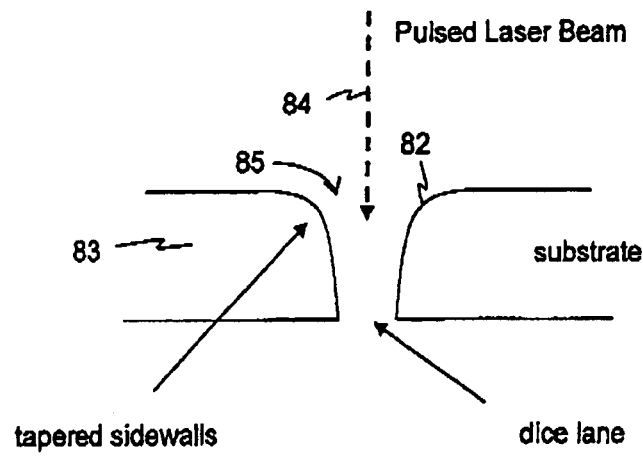
FIG. 8 is a schematic vertical cross-section of tapered dice lane side walls produced according to the invention.

In a further embodiment of the invention, the taper of a laser dice lane 85, cut with a laser beam 84 in a substrate 83, may be varied in order to produce convex arcuate die sidewalls 82, as shown in FIG. 8, to produce a cut which tapers in a direction of the laser beam 84. As in the previously described embodiment, this results in increased die strength by removing potential stress points at sharp corners. Tapering of the dice lane sidewalls is achieved by varying the width of the dice lane as the laser beam scans down through the substrate. The tapered sidewalls shown in FIG. 8 are achieved by reducing the number of adjacent laser scans in the dice lane as the depth machined into the substrate increases.

As illustrated in FIG. 10, a substrate 103 to be machined may be mounted on a transport tape 110, for example to singulate die 101 by machining dice lanes 102 in the substrate 103 in that case, the laser beam energy may be controlled in final passes through the substrate to ensure that damage to the tapes does not occur, as described above in relation to FIG. 9(iii). Alternatively, or in addition, a tape 110 may be used, such as a polyolefin-based tape, which is substantially transparent to an ultraviolet laser light beam 104 used to machine the substrate 103, such that, with suitable choices of machining process parameters, substantially no damage occurs to the tape.

The invention is not limited to the embodiments described but may be varied in construction and detail.

The invention claimed is:

1. A method of dicing a semiconductor wafer having an active layer on a major surface of the semiconductor wafer, the method comprising:
   mounting the semiconductor wafer on a carrier with the active layer facing away from the carrier;
   directing laser emission in a scan field for incidence on the major surface, the laser emission at least partially dicing the semiconductor wafer on the carrier and thereby forming an at least partially diced semiconductor wafer having material connecting adjacent die; and
   providing an active gas for etching from the at least partially diced semiconductor wafer on the carrier the material connecting adjacent die to remove sufficient semiconductor material from a die produced from the at least partially diced semiconductor wafer to singulate the adjacent die and improve die strength.

2. A method as claimed in claim 1, further comprising:
   providing a gaseous environment for the semiconductor wafer;
   using the gaseous environment to control a chemical reaction with the semiconductor wafer at least one of prior to and during dicing of the semiconductor wafer to enhance the die strength.

3. A method as claimed in claim 2, wherein the providing of the gaseous environment comprises providing a passive inert gas environment for substantially preventing oxidation of walls of a die during machining.

4. A method as claimed in claim 2, wherein the providing of the gaseous environment comprises providing an active gas environment including the active gas, in which the active gas is chemically reactive to the semiconductor wafer.

5. A method as claimed in claim 4, wherein the providing of the active gas environment comprises reducing debris, produced during machining, adhering to surfaces of machined die.

6. A method as claimed in claim 4, wherein the etching comprises etching the semiconductor wafer within the active gas environment.

7. A method as claimed in claim 1, wherein the etching comprises etching walls of a die with the active gas to reduce surface roughness of the walls and thereby improve the die strength.

8. A method as claimed in claim 1, wherein the etching comprises etching walls of a die with the active gas substantially to remove a heat affected zone produced during machining, and thereby improve the die strength.

9. A method as claimed in claim 1, wherein the at least partially dicing the semiconductor wafer comprises dicing the semiconductor wafer completely through the semiconductor wafer; and the etching the semiconductor wafer comprises etching sidewalls of the die, remaining portions of the die being masked from the active gas by portions of the active layer on the die.

10. A method as claimed in claim 1, wherein the semiconductor wafer is a silicon wafer.

11. A dicing apparatus for dicing a semiconductor wafer having an active layer on a major surface of the semiconductor wafer, the apparatus comprising:
   a carrier on which the semiconductor wafer is mountable with the active layer facing away from the carrier;
   a laser configured to produce laser emission for directing the laser emission in a scan field for incidence on the major surface, the laser emission configured to at least partially dice the semiconductor wafer on the carrier to form an at least partially diced semiconductor wafer; and
   a gas delivery head configured to provide an active gas to etch from the at least partially diced semiconductor wafer on the carrier to remove sufficient semiconductor material from a die produced from the at least partially diced semiconductor wafer to singulate the die and improve die strength.

12. An apparatus as claimed in claim 11, further comprising a gas handling system configured to provide a gaseous environment for the semiconductor wafer and to control a chemical reaction with the semiconductor wafer at least one of prior to and during dicing of the semiconductor wafer to enhance the die strength.

13. A dicing apparatus as claimed in claim 12, wherein the gaseous environment comprises an active gas environment for etching the semiconductor wafer mounted on the carrier within the active gas environment.

14. A dicing apparatus as claimed in claim 11, wherein the dicing apparatus is configured to dice a silicon wafer.

\* \* \* \* \*